US012676365B2

(12) United States Patent
Eilken et al.

(10) Patent No.: US 12,676,365 B2
(45) Date of Patent: Jul. 7, 2026

(54) SHORT CIRCUIT BASED PUNCTURE DETECTION FOR BEV PROTECTION PLATES

(71) Applicant: TOYOTA MOTOR ENGINEERING & MANUFACTURING NORTH AMERICA, INC., Plano, TX (US)

(72) Inventors: David R. Eilken, Ann Arbor, MI (US); Taesoo Kim, Ann Arbor, MI (US); Jason Cremer, Stockbridge, MI (US)

(73) Assignees: TOYOTA MOTOR ENGINEERING & MANUFACTURING NORTH AMERICA, INC., Plano, TX (US); TOYOTA JIDOSHA KABUSHIKI KAISHA, Aichi-ken (JP)

( * ) Notice: Subject to any disclaimer, the term of this patent is extended or adjusted under 35 U.S.C. 154(b) by 706 days.

(21) Appl. No.: 18/174,991

(22) Filed: Feb. 27, 2023

(65) Prior Publication Data

US 2024/0291081 A1    Aug. 29, 2024

(51) Int. Cl.
| | |
|---|---|
| *H01M 50/14* | (2021.01) |
| *G01R 31/52* | (2020.01) |
| *H01M 10/42* | (2006.01) |
| *H01M 10/625* | (2014.01) |

(52) U.S. Cl.
CPC ............ *H01M 50/14* (2021.01); *G01R 31/52* (2020.01); *H01M 10/4257* (2013.01); *H01M 10/625* (2015.04); *H01M 2220/20* (2013.01)

(58) Field of Classification Search
CPC ............. H01M 50/14; H01M 10/4257; H01M 10/625; H01M 2220/20; H01M 10/425; H01M 10/48; H01M 50/249; G01R 31/52; B60L 3/0046; B60L 50/64
USPC ........................................................ 320/109
See application file for complete search history.

(56) References Cited

U.S. PATENT DOCUMENTS

| | | | | |
|---|---|---|---|---|
| 8,241,772 | B2 * | 8/2012 | Hermann | .............. H01M 10/42 |
| | | | | 429/61 |
| 8,389,139 | B2 * | 3/2013 | Hermann | .......... H01M 50/3425 |
| | | | | 429/7 |
| 9,306,247 | B2 | 4/2016 | Rawlinson | |
| 9,595,790 | B1 * | 3/2017 | Cao | ................. H01R 13/62911 |
| 10,340,559 | B2 * | 7/2019 | Kwon | .............. H01M 10/6551 |

(Continued)

FOREIGN PATENT DOCUMENTS

| | | | | | |
|---|---|---|---|---|---|
| CN | | 108091813 | A * | 5/2018 | ............. H01M 4/04 |
| CN | | 115313333 | A * | 11/2022 | ............ B60L 3/0023 |

(Continued)

*Primary Examiner* — M Baye Diao
(74) *Attorney, Agent, or Firm* — HAYNES AND BOONE, LLP

(57) ABSTRACT
Method and systems for determining a battery electric vehicle (BEV) protection plate has been damaged. A BEV protection plate includes a circuit. The circuit includes a plurality of conductive tabs. The BEV protection is separated from a battery housing by an opening. The conductive tabs extend from the circuit disposed on the BEV protection plate into the opening. A diagnostic device measures a voltage of the battery housing. A controller is in communication with the diagnostic device, determines a short circuit based on the measured voltage of the battery housing; and outputs to a display a notification that the BEV protection plate is compromised.

20 Claims, 10 Drawing Sheets

(56) References Cited

U.S. PATENT DOCUMENTS

| 11,287,478 | B2 | | 3/2022 | Min et al. | |
|---|---|---|---|---|---|
| 11,870,048 | B2 | * | 1/2024 | Fröhlich | H01M 10/6567 |
| 12,027,715 | B2 | * | 7/2024 | Seo | H01M 50/271 |
| 12,261,280 | B2 | * | 3/2025 | Boyer | H01M 10/658 |
| 2017/0259678 | A1 | * | 9/2017 | Cao | B60L 53/35 |
| 2017/0365888 | A1 | * | 12/2017 | Kwon | H01M 10/4207 |
| 2019/0181419 | A1 | * | 6/2019 | Suba | H01M 10/0525 |
| 2020/0243814 | A1 | * | 7/2020 | Kang | H01M 50/264 |
| 2021/0188093 | A1 | | 6/2021 | Gyani | |
| 2022/0029215 | A1 | | 1/2022 | Kellner et al. | |

FOREIGN PATENT DOCUMENTS

| DE | 102017002383 | A1 | 11/2017 |
|---|---|---|---|
| DE | 102017206663 | A1 | 10/2018 |
| EP | 3392070 | A1 | 10/2018 |
| FR | 3089464 | A1 | 6/2020 |

* cited by examiner

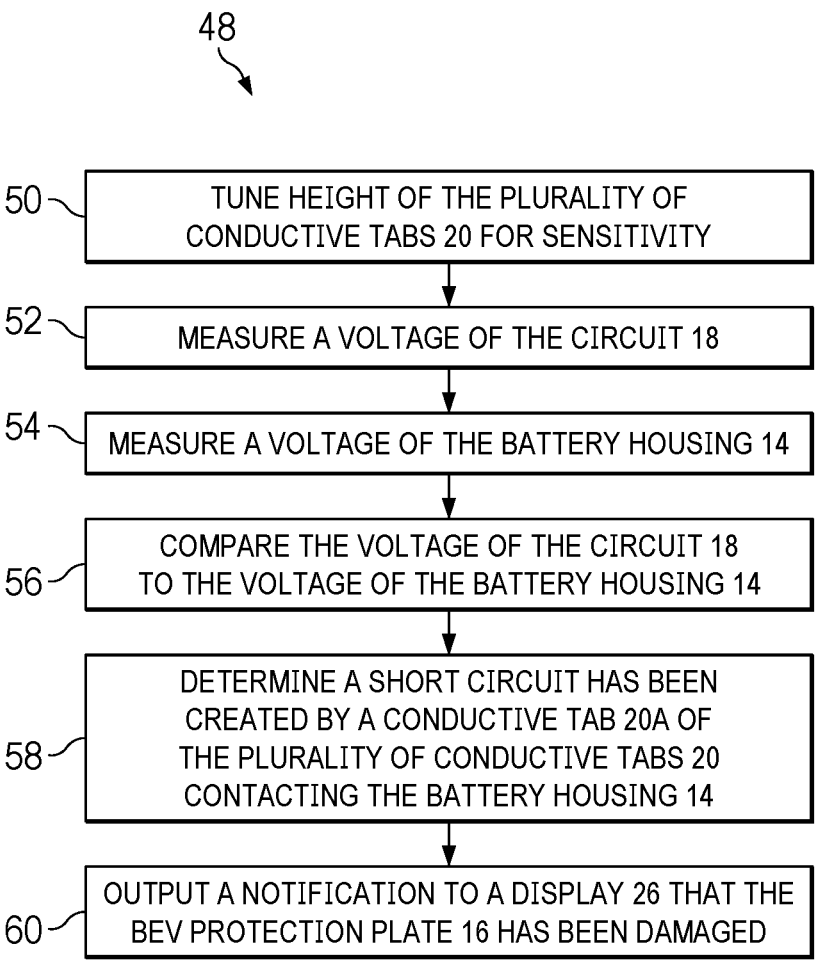

48

| 50 | TUNE HEIGHT OF THE PLURALITY OF CONDUCTIVE TABS 20 FOR SENSITIVITY |
| 52 | MEASURE A VOLTAGE OF THE CIRCUIT 18 |
| 54 | MEASURE A VOLTAGE OF THE BATTERY HOUSING 14 |
| 56 | COMPARE THE VOLTAGE OF THE CIRCUIT 18 TO THE VOLTAGE OF THE BATTERY HOUSING 14 |
| 58 | DETERMINE A SHORT CIRCUIT HAS BEEN CREATED BY A CONDUCTIVE TAB 20A OF THE PLURALITY OF CONDUCTIVE TABS 20 CONTACTING THE BATTERY HOUSING 14 |
| 60 | OUTPUT A NOTIFICATION TO A DISPLAY 26 THAT THE BEV PROTECTION PLATE 16 HAS BEEN DAMAGED |

SHORT CIRCUIT BASED PUNCTURE DETECTION FOR BEV PROTECTION PLATES

TECHNICAL FIELD

The present disclosure generally relates to detecting a damaged component of an automotive vehicle, and, more particularly, to using a short circuit to detect damage to battery protection plates.

BACKGROUND

Modern electric vehicles include a BEV protection plate to protect batteries from damage. The BEV protection plate is often placed underneath the vehicle. The design of the BEV protection plates have continually increased in strength to reduce cell damage to the battery, but a critical threshold remains in which cell damage will occur. If the BEV protection plate is damaged, the battery may also be damaged or more likely to become damaged in the near future, since the BEV protection plate has been compromised.

In some conventional systems, no puncture detection is provided for the BEV protection plates, which requires drivers of electric vehicles (EV) to detect damage to the BEV protection plate by physically inspecting the underside of the vehicle and the BEV protection plate. In other conventional systems for puncture detection, a sensor, such as a capacitive sensor, is embedded within the BEV protection plate, and the sensor is electrically isolated, which is very costly and lacks the ability to tune sensitivity locally, so that areas near supports are less sensitive than in the center of the BEV protection plate between supports. Additionally, when capacitive systems are embedded within the BEV protection plate the overall strength of the plate is reduced. Other conventional systems may use a more robust protection plate, but do not include any sensing capability.

A system and method are needed that provides the driver with automatic puncture detection with local sensitivity tuning and spatial locating, while also being affordable.

SUMMARY

In one example embodiment, a method includes receiving an indication of a force being applied to a battery electric vehicle (BEV) protection plate such that at least one conductive tab of a circuit of the BEV protection plate contacts a battery housing, wherein the circuit is disposed on the BEV protection plate; measuring, using a diagnostic device, a voltage of the battery housing, wherein the battery housing is conductive; and determining, using a controller, a short circuit when the measured voltage passes a threshold value.

In another example embodiment, a system includes a battery housing; and a battery electric vehicle (BEV) protection plate; wherein the battery housing is spaced apart from the BEV protection plate by an opening; wherein the BEV protection plate includes a circuit; wherein the circuit includes a plurality of conductive tabs; and wherein the plurality of conductive tabs extend from the circuit disposed on the BEV protection plate into the opening.

In yet another example embodiment, a system includes a battery housing; a battery electric vehicle (BEV) protection plate, wherein the BEV protection plate includes a circuit; wherein the circuit includes a plurality of conductive tabs; wherein the BEV protection plate is spaced apart from the battery housing by an opening, wherein the conductive tabs extend from the circuit disposed on the BEV protection plate into the opening; a diagnostic device, wherein the diagnostic device is configured to measure a voltage of the battery housing; and a controller in communication with the diagnostic device; wherein the controller is configured to: determine a short circuit based on the measured voltage of the battery housing; and output to a display a notification that the BEV protection plate is compromised.

It is to be understood that both the foregoing general description and the following detailed description are exemplary and explanatory in nature and are intended to provide an understanding of the present disclosure without limiting the scope of the present disclosure. In that regard, additional aspects, features, and advantages of the present disclosure will be apparent to one skilled in the art from the following detailed description.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. In addition, the present disclosure may repeat reference numerals, letters, or both in the various examples. This repetition is for the purpose of simplicity and clarity and does not in itself dictate a relationship between the various embodiments and/or configurations discussed.

FIG. 5 is a flow chart diagram of a method of detecting damage to the BEV protection plate using the short circuit-based puncture detection for BEV protection plate system of FIG. 1, according to one or more embodiments.

DETAILED DESCRIPTION

Figure 1:
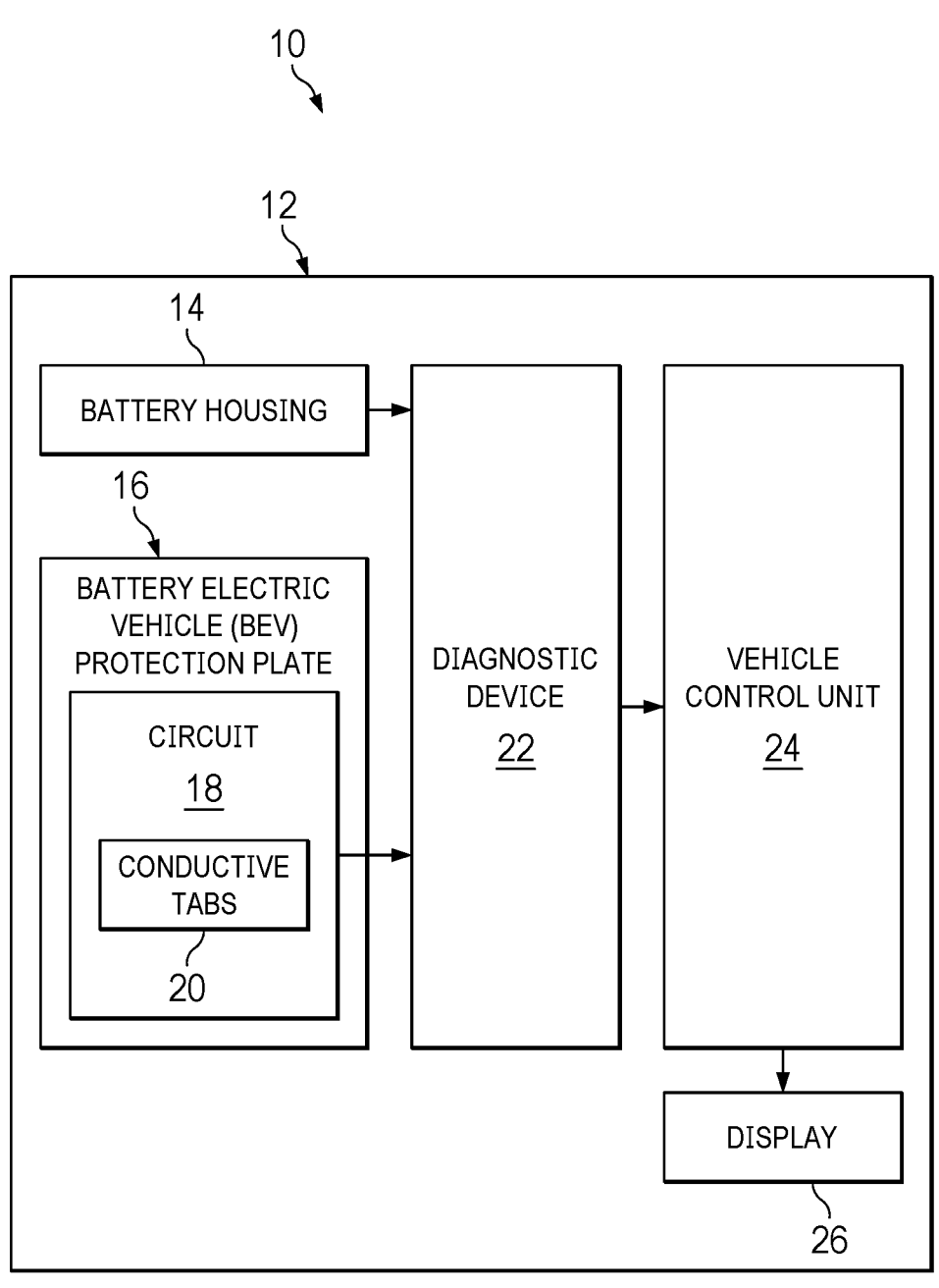
FIG. 1 is a diagrammatic illustration of a short circuit-based puncture detection system for a BEV protection plate, according to one or more embodiments of the present disclosure.

Illustrative embodiments and related methods of the present disclosure are described below as they might be employed in one or more methods and systems for using short circuit-based puncture detection for BEV protection plate. In the interest of clarity, not all features of an actual implementation or method are described in this specification. It will of course be appreciated that in the development of any such actual embodiment, numerous implementation specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure. Further aspects and advantages of the various embodiments and related methods of the disclosure will become apparent from consideration of the following description and drawings.

The example embodiments described below recognize that it may be desirable to have methods and systems that more efficiently and safely determine damage (such as a puncture) to BEV protection plates. In particular, the embodiments described below provide methods and systems for determining whether a vehicle has damage to the BEV protection plate using short circuit-based detection and may notify a driver of the vehicle regarding the damage without requiring the driver to go underneath the vehicle to assess the damage. Therefore, the methods and systems provide an improvement to BEV protection plates.

One or more embodiments described below provide methods and systems for determining if the BEV protection plates have been compromised (such as punctured). The methods and systems may use a diagnostic device to measure a voltage of the battery housing, the battery housing being conductive. The methods and systems may also determine, using a controller (or vehicle control unit), if the measured voltage exceeds a threshold value. The methods and systems may also determine if a short circuit has occurred based on the measured voltage of the battery housing.

One or more embodiments described below provide methods and systems for determining if a short circuit has occurred by measuring a voltage of a circuit of the BEV protection plate and the voltage of a battery housing. The methods and systems may compare, using a controller, the measured voltage of the circuit with the measured voltage of the battery housing to determine if a short circuit occurred.

One or more embodiments described below provide methods and systems for determining if a BEV protection plate has been damaged based on if a short-circuit occurred. The system may change based on the presence of a force (pressure or load) impacting the BEV protection plate. The force may push the BEV protection upwards toward the battery housing such that conductive tabs of a circuit of the BEV contact the battery housing and create a short circuit, in some embodiments.

Referring to FIG. 1, in an embodiment, a short circuit-based puncture detection system for a BEV protection plate is generally referred to by reference numeral 10. In one example embodiment, the short circuit-based puncture detection for BEV protection plate system 10 includes a vehicle 12. The vehicle 12 includes a battery housing 14 and a battery electric vehicle (BEV) protection plate 16. The BEV protection plate 16 includes a circuit 18 with conductive tabs 20. The vehicle 12 also includes one or more one or more diagnostic device(s) 22, a Vehicle Control Unit 24, and a display 26. The battery housing 14 is operably coupled to, and adapted to be in communication with, the one or more diagnostic device(s) 22. The circuit 18 is operably coupled to, and adapted to be in communication with, the one or more diagnostic device(s) 22. The one or more diagnostic device(s) 22 is operably coupled to and adapted to be in communication with the Vehicle Control Unit 24. The Vehicle Control Unit 24 is operably coupled to and adapted to be in communication with the display 26.

In some embodiments, the vehicle 12 may be an automotive vehicle. It is noted that the components of the vehicle 12 may be located either permanently or temporarily as a part of the vehicle 12. In one or more embodiments, one or more components of the vehicle 12 (e.g., one or more diagnostic device(s) 22, Vehicle Control Unit 24, and display 26) may be omitted or substituted from the short circuit-based puncture detection for BEV protection plate system 10. In one or more embodiments, the vehicle 12 is an electric vehicle. In some embodiments, the vehicle 12 is a hybrid vehicle. It is understood that other components or arrangements of components may be found in a vehicle 12, and that the same general principles apply to electric vehicles and hybrid vehicles.

In some embodiments, the battery housing 14 encases an entire battery. In one or more embodiments, the battery housing 14 covers only the bottom portion of a battery (i.e., the bottom portion of the battery faces the ground or road). In some embodiments, the battery housing 14 includes a battery. The battery may be any device used as a source of electrical power, such as any device that converts chemical energy into electrical energy. In some embodiments, the battery may include one or more electrochemical cells with external connections for powering an electrical system of vehicle 12. The battery may be rechargeable, such as by an alternator, and may include many types of configurations such as lithium ion, lead-acid, wet cell, and the like. In some embodiments, the battery is a plug-in hybrid vehicle battery (PHEV), fuel cell, vehicle battery pack, and the like. In one or more embodiments, the battery housing 14 is conductive. In some embodiments, only the bottom portion of the battery is conductive. In one or more embodiments, the battery housing 14 is formed with a conductive material such as aluminum and the like. In other embodiments, the battery housing may include or be replaced with a receiving circuit. The receiving circuit may be a conductive layer below the battery housing.

In one or more embodiments, the BEV protection plate 16 is spaced from the battery housing 14 forming an opening. In some embodiments, the BEV protection plate 16 extends along the battery housing 14. In one or more embodiments, the BEV protection plate 16 includes a plurality of BEV protection plates 16. In one or more embodiments, the BEV protection plate 16 extends past the battery housing. In some embodiments, the BEV protection plate 16 is formed with a conductive material. In other embodiments, a portion of the BEV protection plate 16 is formed with a non-conductive material, but a portion of the BEV protection plate 16 that includes the circuit 18 is formed with a conductive material. In one or more embodiments, the BEV protection plate 16 is instead a PHEV plate, fuel cell plate, vehicle battery pack, and the like.

In some embodiments, the circuit 18 may be integrally formed in the BEV protection plate 16. In some embodiments, the circuit 18 is formed within the BEV protection plate 16. In other embodiments, the circuit 18 may be a separate component attached or coupled to the BEV protection plate 16. In some embodiments, the circuit 18 is formed with aluminum, copper, or another conductive material. In some embodiments, the circuit 18 may be designed in a variety of patterns, some of which are discussed herein.

In one or more embodiments, the circuit 18 includes a plurality of conductive tabs 20. The plurality of conductive tabs 20 may be designed in a variety of shapes, as discussed herein. In some embodiments, the plurality of conductive tabs 20 may be formed of aluminum, copper, or another conductive material. In some embodiments, the circuit 18 includes the plurality of conductive tabs 20 with a plurality of differing shapes for the tabs.

In some embodiments, the one or more diagnostic device(s) 22 is a voltage sensor, a voltage transducer, a current sensor, current transducer, or the like. Sub-components of the one or more diagnostic device(s) 22 may be deployed at any operational area where information on the status or damage of the BEV protection plate 16 of the vehicle 12 may occur. In some embodiments, the one or more diagnostic device(s) is a sub-component of the battery housing 14 and/or a sub-component of the circuit 18 of BEV protection plate 16. In some embodiments, the one or more diagnostic device(s) 22 is a plurality of one or more diagnostic device(s). In some embodiments, the one or more diagnostic device(s) 22 is/are a component of vehicle control unit 24.

In some embodiments, the vehicle control unit 24 includes a processor and a memory. In some embodiments, the vehicle control unit 24 may be any logic device, controller, processor, module, circuitry, or device configured to perform one or more operations. In one or more embodiments, the vehicle control unit 24 may be a processing device, electronic control unit (ECU), a microcontroller, a field programmable gate array (FPGA), a controller, an application specific integrated circuit (ASIC), memory storage device, memory reader, or the like, in one or more embodiments.

In one or more embodiments, the vehicle 12 includes a display 26 located within a cabin of the vehicle 12. In some embodiments, the display 26 is positioned behind a steering wheel of the driver. In other embodiments, the display 26 is positioned in a middle console. In some embodiments, the display 26 includes a graphical user interface with graphical indicators. In some embodiments, the graphical indicators include an icon. The icon may indicate damage to the BEV protection plate 16. In some embodiments, the icon is displayed in a particular color. In some embodiments, the icon changes color based on the severity of the damage to the BEV protection plate 16. For example, the icon may be yellow when a change in voltage has been briefly registered, but the icon may change to red when there is a sustained short circuit. In some embodiments, the icon is backlit when damage to the BEV protection plate 16 has been determined. In some embodiments, an audio-visual alert is used to alert the driver that there is damage to the BEV protection plate

16. In some embodiments, the display 26 is replaced with an auditory alert to notify the driver that the BEV protection plate 16 has been damaged. In some embodiments, a message appears on the graphical user interface of the display 26 notifying the driver that damage to the BEV protection plate 16 has occurred. In some embodiments, the display 26 notifies the driver that there has also been damage to the battery housing 14 and/or battery of the vehicle 12. In some embodiments, the display 26 is a human machine interface. In some embodiments, the display 26 informs the driver to get the vehicle 12 serviced to fix the BEV protection plate 16. In some embodiments, the display 26 may also indicate that the battery housing 14 and/or the battery is compromised. The display 26 may use a separate icon to notify the driver that the battery housing 14 and/or the battery is compromised.

In operation, with continuing reference to FIG. 1, as the driver operates (e.g., drives) vehicle 12, the one or more diagnostic device(s) 22 measures the voltage of the battery housing 14, which is conductive. Before the vehicle 12 encounters damage to the BEV protection plate 16, the BEV protection plate 16 is spaced away from the battery housing 14. The plurality of conductive tabs 20 of the circuit 18 extend upward from the BEV protection plate 16, but the plurality of conductive tabs 20 do not touch the battery housing 14. Therefore, the circuit 18 has a voltage but the battery housing 14 does not. As the driver drives the vehicle 12, the driver hits an object that applies a force (such as load or pressure) to the BEV protection plate 16. This added force pushes the BEV protection plate 16 along with the circuit 18 and the plurality of conductive tabs 20 upward toward the battery housing 14. If the object applies enough force (or creates enough damage), then at least one conductive tab of the plurality of conductive tabs 20 will touch the battery housing 14, which will cause a short circuit. A short circuit is an abnormal connection between two points of an electrical circuit such that the current is allowed to travel along a different path with low resistance. Here, the plurality of conductive tabs 20 connect to the conductive battery housing 14, and the current is now able to travel along this different path (i.e., the battery housing 14). Then the one or more diagnostic device(s) 22, which is operably coupled with the battery housing 14, will detect a voltage in the battery housing 14 and transmit that information/signal to the vehicle control unit 24. The vehicle control unit 24 will determine that the BEV protection plate 16 has been damaged such as by a puncture and transmit a signal and/or data to the display 26. The display 26 will notify the drive that the BEV protection plate 16 has been damaged.

In one or more embodiments, the BEV protection plate 16 is in communication with and/or operably coupled to the one or more diagnostic device(s) 22. In one or more embodiments, the BEV protection plate 16 is in communication with and/or operably coupled to the vehicle control unit 24. In one or more embodiments, the circuit 18 is in communication with and/or operably coupled to the vehicle control unit 24. In one or more embodiments, the plurality of conductive tabs 20 is in communication with and/or operably coupled to the one or more diagnostic device(s) 22.

In some embodiments, the one or more diagnostic device(s) 22 is a device that is configured to read and/or sense voltage. In some embodiments, the one or more diagnostic device(s) 22 is a device that is configured to read and/or sense resistance. In some embodiments, the one or more diagnostic device(s) 22 is a device that is configured to read and/or sense current. In one or more embodiments, the one or more diagnostic device(s) 22 measures the voltage of the circuit 18. In some embodiments, the one or more diagnostic device(s) 22 may be configured to sense or detect activity, conditions, and circumstances in an area to which the device has access, e.g., conditions inside or outside the vehicle. In some embodiments, the one or more diagnostic device(s) 22 is coupled and/or in communication with the battery housing 14, and another one or more diagnostic device(s) 22 is coupled to and/or in communication with the circuit 18 of the BEV protection plate 16. In other embodiments, the one or more diagnostic device(s) 22 is coupled to and/or in communication with both the battery housing 14 and the circuit 18 of the BEV protection plate 16. In some embodiments, the one or more diagnostic device(s) 22 only measures voltage and/or current the battery housing 14. In other embodiments, the one or more diagnostic device(s) 22 only measures voltage and/or current of the circuit 18.

In one or more embodiments, vehicle control unit 24 receives an output (such as a signal, data, or information) from the one or more diagnostic device(s) 22. In one or more embodiments, vehicle control unit 24 determines the voltage from the battery housing 14. In some embodiments, the vehicle control unit 24 also determines the voltage of the circuit 18 of the BEV protection plate. In one or more embodiments, vehicle control unit 24 determines the current from the battery housing 14. In some embodiments, the vehicle control unit 24 also determines the current of the circuit 18 of the BEV protection plate. In one or more embodiments, vehicle control unit 24 determines the voltage from the battery housing 14 and the circuit 18 of the BEV protection plate. In some embodiments, the vehicle control unit 24 may be configured to execute, store, and receive instructions (e.g., software instructions) for controlling various operations of vehicle 12, such as the short circuit-based puncture detection for BEV protection plate system 10.

In one or more embodiments, software instructions of the vehicle control unit 24 also implement methods for processing sensor signals, data (such as voltage or current data), determining sensor information, determining voltage information, providing user feedback (e.g., through display 26), or performing any of the various operations described herein. In some embodiments, the vehicle control unit 24 may be in communication with the display 26. In some embodiments, the vehicle control unit 24 sends a signal and/or request to the display 26 to display a visual alert, such as an icon, on the display 26. In some embodiments, the vehicle control unit 24 sends a signal and/or request to the display 26 to produce an auditory alert. In some embodiments, the vehicle control unit 24 may be configured to receive data from the one or more diagnostic device(s) 22. In one or more embodiments, the vehicle control unit 24 may receive information from the circuit 18 and the battery housing 14. In some embodiments, the vehicle control unit 24 receives and transmits data and/or signals over wired or wireless means.

Before continuing, it should be noted that the examples described above are provided for purposes of illustration and are not intended to be limiting. Other devices and/or device configurations may be utilized to carry out the operations described herein.

Figure 2:
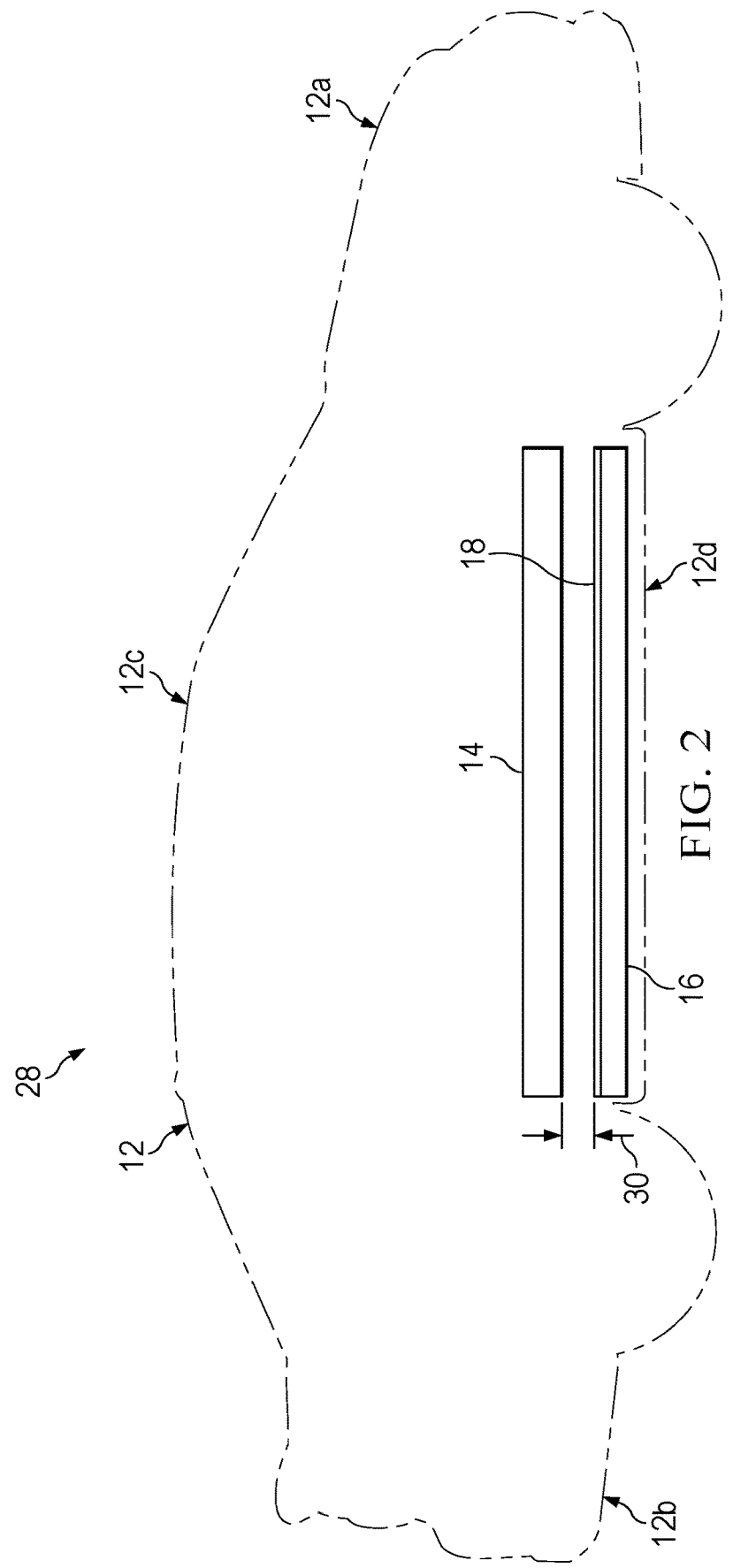
FIG. 2 is a diagrammatic illustration of the short circuit-based puncture detection system for the BEV protection plate of FIG. 1, according to one or more embodiments.

With reference to FIG. 2 and continuing reference to FIG. 1, a diagrammatic illustration of the short circuit-based puncture detection of FIG. 1, in an embodiment, is generally referred to by reference numeral 28 and contains some of the components as shown in the previous figure, the components of which are given the same reference numeral. In one example embodiment, the short circuit-based puncture detection for BEV protection plate system of FIG. 1 28 includes vehicle 12, battery housing 14, BEV protection plate 16, the circuit 18, and an opening 30.

The vehicle 12 may include a front portion 12a, a rear portion 12b, a top portion 12c, and a bottom portion 12d. In some embodiments, the battery housing 14, the BEV protection plate 16, and the circuit 18, and the opening 30 may be located at or toward the bottom portion 12d of vehicle 12. In some embodiments, the battery housing 14, the opening 30, the circuit 18, and the BEV protection plate 16 are stacked on top of each other, with the battery housing 14 positioned closest to the top portion 12c and the BEV protection plate 16 positioned closest to the bottom portion 12d.

The opening 30, in some embodiments, is the space between the BEV protection plate 16 and the battery housing 14. In other embodiments, the opening 30 is the space between the plurality of conductive tabs 20 and the battery housing 14. In some embodiments, a size of the opening may vary depending on at least one or more of: the type of battery, the type and/or shape of conductive tab 20, the model of the vehicle 12, if an object has hit the vehicle 12, the location of support beams or structures of the vehicle 12, and the like. The size of the opening 30 for vehicle 12 may vary, during ownership of the vehicle 12, depending on if an object has applied a force (such as an upward force) to the BEV protection plate 16.

In operation, with continuing reference to FIG. 1 and FIG. 2, as the driver operates (e.g., drives) vehicle 12, the one or more diagnostic device(s) 22 measures the voltage of the battery housing 14, which is conductive. Before the vehicle 12 encounters damage to the BEV protection plate 16, the BEV protection plate 16 is spaced away from the battery housing 14 such that the opening 30 is between the BEV protection plate 16 and the battery housing 14. The plurality of conductive tabs 20 of the circuit 18 extend into the opening 30, but the plurality of conductive tabs 20 do not touch the battery housing 14. Therefore, the circuit 18 has a voltage but the battery housing 14 does not. As the driver drives the vehicle 12, the driver hits an object that applies a force (such as load or pressure) to the BEV protection plate 16. This added force pushes the BEV protection plate 16 along with the circuit 18 and the plurality of conductive tabs 20 upward toward the battery housing 14, which causes the opening 30 to shrink. If the object applies enough force (or creates enough damage), then one or more conductive tabs 20 will touch the battery housing 14, which will cause a short circuit. A short circuit is an abnormal connection between two points of an electrical circuit such that the current is allowed to travel along a different path with low resistance. Here, the plurality of conductive tabs 20 connect to the conductive battery housing 14, and the current is now able to travel along this different path (i.e., the battery housing 14). Then the one or more diagnostic device(s) 22, which is operably coupled with the battery housing 14, will detect a voltage in the battery housing 14 and transmit that information/signal to the vehicle control unit 24. The vehicle control unit 24 will determine that the BEV protection plate 16 has been damaged such as by a puncture and transmit a signal and/or data to the display 26. The display 26 will notify the drive that the BEV protection plate 16 has been damaged, compromised, or punctured.

Figure 3:
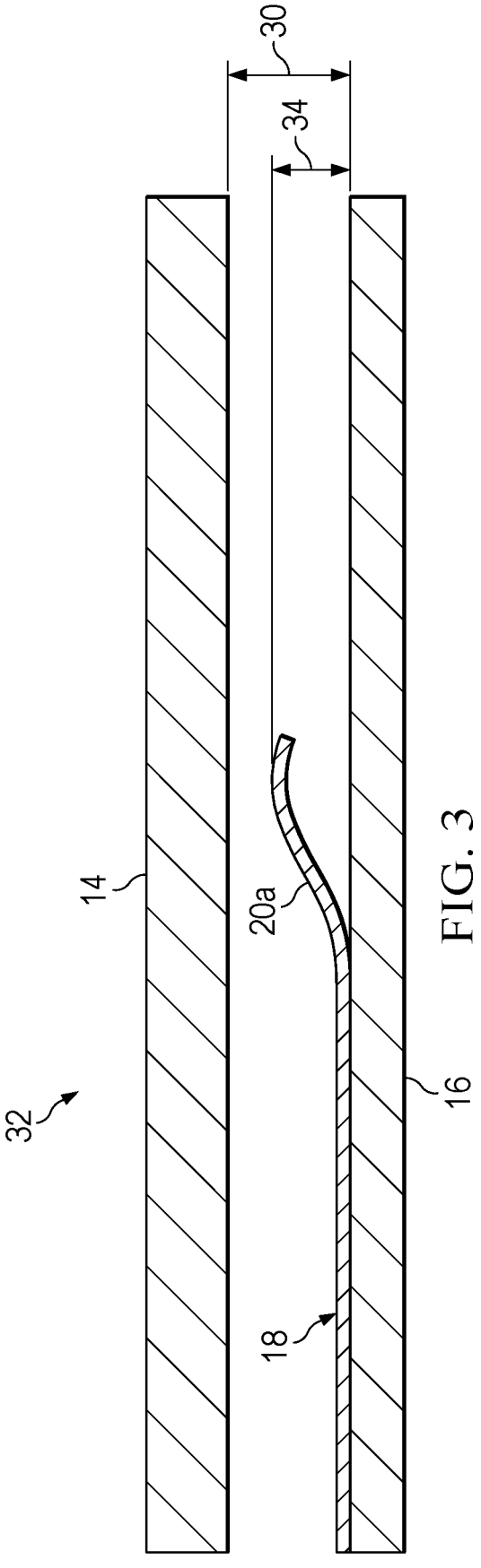
FIG. 3 is a diagrammatic illustration of a portion of the short circuit-based puncture detection system of FIG. 1, according to one or more embodiments.

With reference to FIG. 3 and continuing reference to FIGS. 1 and 2, a diagrammatic illustration of a portion of the short circuit-based puncture detection system of FIG. 1, in an embodiment, is generally referred to by reference numeral 32 and contains some of the components as shown in the previous figure, the components of which are given the same reference numeral. The portion of the short circuit-based puncture detection system of FIG. 1 32, according to one or more embodiments, includes battery housing 14, BEV protection plate 16, circuit 18, a conductive tab 20a of the plurality of conductive tabs 20, opening 30, and tuning height 34. The opening 30 may extend from BEV protection plate 16 to battery housing 14. The conductive tab 20a is shaped as a concave conductive tab, as shown in this side view of a portion of FIG. 1, according to one or more embodiments. The conductive tab 20a can be sized and shaped to alter sensitivity of the conductive tab 20a. The tuning height 34 is the height from the apex of the conductive tab 20a (or the portion of the conductive tab 20a closest to the battery housing 14) to the BEV protection plate 16.

In some embodiments, the tuning height 34 is one way to alter the sensitivity of the short circuit-based puncture detection for BEV protection plate system 10 or the portion of the short circuit-based puncture detection for BEV protection plate system of FIG. 1 32.

In operation, with continuing reference to FIGS. 1-3, by making the tuning height 34 small (distance between apex of the conductive tab 20a to the BEV protection plate 16), the sensitivity is decreased. Therefore, a greater force is needed to push the BEV protection plate 16 upward such that the conductive tab 20a touches the battery housing 14 creating a short circuit, as described herein. Alternatively, by making the tuning height 34 large (distance between apex of the conductive tab 20a to the BEV protection plate 16), the sensitivity is increased. Therefore, a smaller force (in comparison to a conductive tab 20a that has a smaller tuning height 34) is needed to push the BEV protection plate 16 upward such that the conductive tab 20a touches the battery housing 14 creating a short circuit, as described herein.

In some embodiments, the plurality of conductive tabs 20 have varying sensitivity on circuit 18. In one or more embodiments, the tuning height 34 varies for the plurality of conductive tabs 20 over the circuit 18. In some embodiments, the sensitivity and the tuning height 34 is decreased near support beams, support structures, and frames of the vehicle 12, as those areas of the vehicle 12 are more protected from damage and/or puncture. In some embodiments, the sensitivity and the tuning height 34 is increased in areas away from support beams, support structures, and frames of the vehicle 12. In some embodiments, the sensitivity and the tuning height 34 is increased near the center of the BEV protection plate 16. In some embodiments, a structural analysis is conducted on the BEV protection plate 16, and the plurality of conductive tabs 20 are tuned based on the structural analysis and the likelihood that a particular section of the BEV protection plate 16 will be compromised. In some embodiments, the plurality of conductive tabs 20 are tuned prior to install on the BEV protection plate 16. In other embodiments, the plurality of conductive tabs 20 are tuned after either being attached to the BEV protection plate 16 or because the circuit 18 is integrally formed on the BEV protection plate 16.

Figures 4A, 4B:
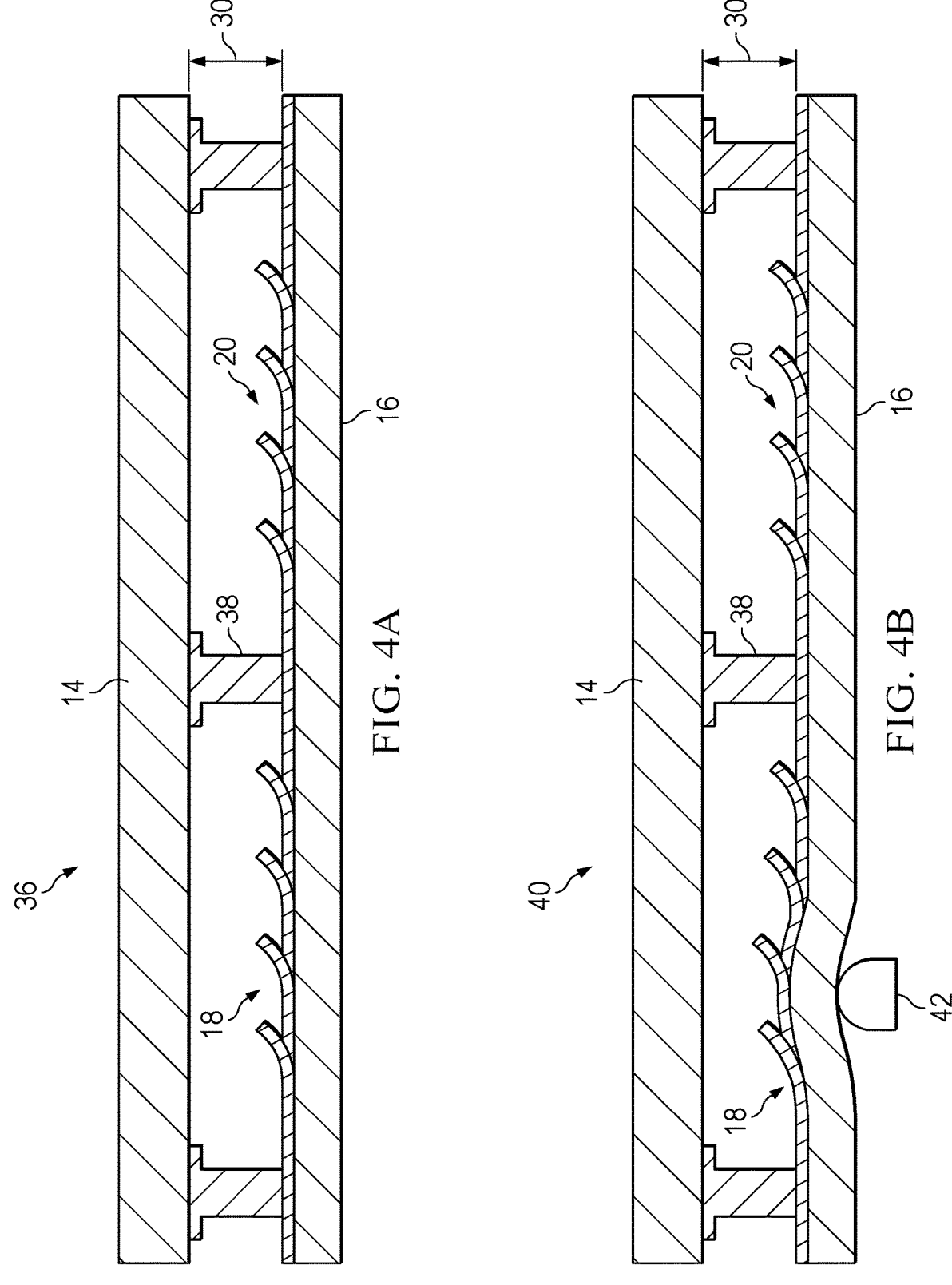
FIG. 4a is a diagrammatic illustration of the BEV protection plate that is not damaged, according to one or more embodiments.
FIG. 4b is diagrammatic illustration of the BEV protection plate minimally damaged, according to one or more embodiments.

With reference to FIG. 4a and continuing reference to FIGS. 1-3, in an embodiment, a diagrammatic illustration of the BEV protection plate 16 not damaged is generally referred to by reference numeral 36 and contains some of the components as shown in the previous figures, the components of which are given the same reference numeral. The BEV protection plate 16 is relatively flat with the circuit 18 disposed on the BEV protection plate 16. The plurality of conductive tabs 20 are shaped so that the plurality of conductive tabs 20 each have a respective concave up shape. The opening 30 extends between the BEV protection plate 16 and the battery housing 14. The plurality of conductive tabs 20 extend into the opening 30 but do not touch the battery housing 14. At least one support beam 38 is positioned between the BEV protection plate 16 and the battery housing 14. The at least one support beam 38 may couple the BEV protection plate 16 to the battery housing 14.

With reference to FIG. 4b and continuing reference to FIGS. 1-4a, in an embodiment, a diagrammatic illustration of the BEV protection plate 16 minimally damaged is generally referred to by reference numeral 40 and contains some of the components as shown in the previous figures, the components of which are given the same reference numeral. The BEV protection plate 16 includes a small indentation from an object 42 on a first side of the BEV protection plate 16. The BEV protection plate 16 also includes the circuit 18 disposed on a second side of the BEV protection plate 16. The second side is opposite the first side. The plurality of conductive tabs 20 are shaped so that the plurality of conductive tabs 20 each have a respective concave upward shape. The opening 30 extends between the BEV protection plate 16 and the battery housing 14. The size of the opening 30 varies along a length of the vehicle due to the object 42. The plurality of conductive tabs 20 extend into the opening 30 but do not touch the battery housing 14. The at least one support beam 38 is positioned between the BEV protection plate 16 and the battery housing 14. The at least one support beam 38 may couple the BEV protection plate 16 to the battery housing 14. The object 42 is in contact with a portion of the BEV protection plate 16. This portion of the BEV protection plate 16 is moved closer to the battery housing (in comparison to FIG. 4a, as well as, in comparison to the other remainder portions of the BEV protection plate 16). The force of coming into contact with object 42 pushes the BEV protection plate 16 and the circuit 18 closer to the battery housing, which moves the plurality of conductive tabs 20 closer to touching the battery housing 14. However, in this embodiment, the plurality of conductive tabs 20 do not contact battery housing 14.

Figure 4C:
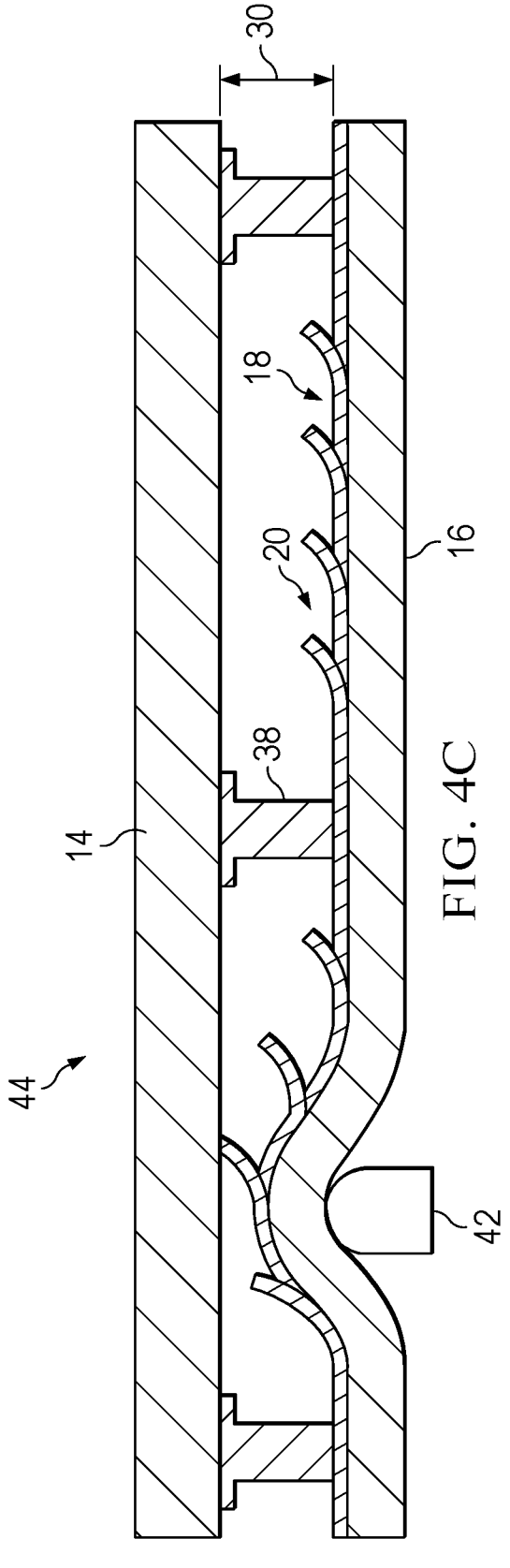
FIG. 4c is a diagrammatic illustration of the BEV protection plate with significant damage, according to one or more embodiments.

With reference to FIG. 4c and continuing reference to FIGS. 1-4c, in an embodiment, a diagrammatic illustration of the BEV protection plate 16 with significant damage is generally referred to by reference numeral 44 and contains some of the components as shown in the previous figures, the components of which are given the same reference numeral. The BEV protection plate 16 includes a large indentation (or puncture) from the object 42 on the first side of the BEV protection plate 16. The BEV protection plate 16 also includes the circuit 18 disposed on the second side of the BEV protection plate 16. The second side is opposite the first side. The plurality of conductive tabs 20 are shaped so that the plurality of conductive tabs 20 each have a respective concave upward shape. The opening 30 extends between the BEV protection plate 16 and the battery housing 14. The size of the opening 30 varies along a length of the vehicle due to the object 42. The plurality of conductive tabs 20 extend into the opening 30, and at least one of the plurality of conductive tabs 20 contacts the battery housing 14. The at least one support beam 38 is positioned between the BEV protection plate 16 and the battery housing 14. The at least one support beam 38 may couple the BEV protection plate 16 to the battery housing 14. The object 42 is in contact with a portion of the BEV protection plate 16. This portion of the BEV protection plate 16 is moved closer to the battery housing (in comparison to FIG. 4a, as well as, in comparison to the other remainder portions of the BEV protection plate 16). The force of coming into contact with object 42 pushes the BEV protection plate 16 and the circuit 18 closer to the battery housing, which moves the plurality of conductive tabs 20, at least one of which, contacts the battery housing 14, creating a short circuit.

With continuing reference to FIGS. 4A-4C, in some embodiments, the at least one support beam 38 includes a plurality of support beams that extend laterally from one side of the vehicle 12 to the other side of vehicle 12. In one or more embodiments, the at least one support beam 38 includes a plurality of support beams that extend longitudinally. In some embodiments, the at least one support beam 38 includes a plurality of support beams. In other embodiments, the at least one support beam 38 includes a frame or structure by which the battery housing 14 is coupled or attached to the BEV protection plate 16. In other embodiments, the at least one support beam 38 is a structural support for the vehicle 12. In some embodiments, the plurality of conductive tabs 20 are not present under the at least one support beam 38. In other embodiments, the plurality of conductive tabs 20 have a smaller tuning height 34 under the at least one support beam 38, than in areas not under the at least one support beam 38.

With continuing reference to FIGS. 4A-4C, object 42, in some embodiments, may be an object such as debris on a road, an object that falls off another vehicle, an uneven or deformed surface in the road, or the like. The object 42 may apply an upward force upon the BEV protection plate 16. In one or more embodiments, the size of the object 42 may impact the amount of upward force applied. In some embodiments, the mass or density of the object 42 may impact the amount of upward force applied (e.g., greater the mass and/or density the more force). In some embodiments, the object 42 creates an indentation in the BEV protection plate 16. In other embodiments, the object 42 punctures the BEV protection plate 16. In yet other embodiments, the object 42 punctures the BEV protection plate 16 and the battery housing 14.

Method 48 is illustrated as a set of operations or blocks 50 through 60 and is described with continuing reference to FIGS. 1-4c. Not all of the illustrated blocks 50 through 60 may be performed in all embodiments of method 48. One or more blocks that are not expressly illustrated in FIG. 5 may be included before, after, in between, or as part of the blocks 50 through 60. In some embodiments, one or more of the blocks 50 through 60 may be implemented, at least in part, by a controller and/or the vehicle control unit 24, in the form of executable code stored on non-transitory, tangible, machine-readable media that when run by one or more processors may cause the one or more processors to perform one or more of the processes. In one or more embodiments, the blocks in method 48 are performed within a vehicle, such as vehicle 12 in FIG. 1, by a vehicle control unit 24, such as an ECU or controller.

In an example embodiment, the method 48 includes: tuning a height of the plurality of conductive tabs 20 for sensitivity at a block 50; measuring a voltage of the circuit 18 at a block 52; measuring a voltage of the battery housing 14 at a block 54; comparing the voltage of the circuit 18 to the voltage of the battery housing 14 at a block 56; determining a short circuit 18 has been created by a conductive tab 20a of the plurality of conductive tabs 20 contacting the battery housing 14 at a block 58; and outputting a notification to a display 26 that the BEV protection plate 16 has been damaged at a block 60.

In some embodiments, the block 50 is omitted. In some embodiments, the block 50 occurs prior to blocks 52-60, such as during manufacturing of the circuit 18. In some embodiments, the plurality of conductive tabs 20 are tuned with a variety of heights, and therefore sensitivities. In some embodiments, the plurality of conductive tabs 20 are all uniform in height. In some embodiments, the plurality of conductive tabs 20 are given different shapes such as concave up, concave down, spiral, spring, and the like to tune the conductive tabs differently based on location on the BEV protection plate 16.

In some embodiments, prior to block 52 or block 54 the method 48 includes receiving an indication that a force has been applied to the BEV protection plate. In one or embodiments, an indication is a signal. In some embodiments, the indication is that at least one conductive tab of the plurality of conductive tabs 20 is touching the battery housing 14.

In some embodiments, the block 52 is omitted. In some embodiments, the block 52 occurs during manufacturing to test the circuit 18. In some embodiments, the current is measured rather than the voltage of the circuit 18. In some embodiments, the one or more diagnostic device(s) 22 measures the voltage and/or current of the circuit 18. In other embodiments, a device separate from vehicle 12 such as a multimeter is used to test the voltage of the circuit 18 to determine a baseline voltage value for the circuit 18. In some embodiments, the voltage value of the circuit is sent from the circuit 18 to the vehicle control unit 24. In some embodiments the voltage value is sent from the one or more diagnostic device(s) 22 to the vehicle control unit 24. In some embodiments, the vehicle control unit 24 stores the voltage value.

In some embodiments, the block 54 measures a voltage of the battery housing 14 prior to the block 52 or contemporaneously with the block 52. In some embodiments, the block 54 is omitted. In one or more embodiments, the block 54 measures current of the battery housing 14 rather than voltage. In some embodiments, the one or more diagnostic device(s) 22 measures the voltage and/or current of the battery housing 14. In some embodiments, the one or more diagnostic device(s) 22 sends the measurements (voltage, current, or resistance data) to the vehicle control unit 24. In some embodiments, the vehicle control unit 24 stores the voltage, resistance, or current data of the battery housing 14. In some embodiments, a different one or more diagnostic device(s) 22 is used to measure the voltage, resistance, and/or current of the battery housing 14 than the one or more diagnostic device(s) used to measure the voltage and/or current of the circuit 18. In some embodiments, the one or more diagnostic device(s) 22 measures the voltage, current, and/or resistance of a receiving circuit coupled to the battery housing 14.

In some embodiments, the block 56 is omitted. In some embodiments, the measured voltage of the circuit 18 is stored previously and compared to a current voltage of the battery housing 14. In some embodiments, the current voltage of the circuit 18 is compared to the current voltage of the battery housing 14. In some embodiments, the block 56 is replaced with determining that the voltage of the battery housing 14 has surpassed a stored threshold. In one or more embodiments, the vehicle control unit 24 stores a threshold value for voltage of the battery housing 14. If the voltage of the battery housing 14 surpasses the threshold value, then the block proceeds to block 58 and a short circuit is determined. If the voltage of the battery housing 14 is less than the threshold, then the method proceeds to the block 54. In some embodiments, current or resistance of the battery housing 14 may be calculated. In some embodiments, current or resistance of the circuit 18 may be calculated at the block 56. In some embodiments, the vehicle control unit 24 performs the block 56.

In some embodiments, the vehicle control unit 24 performs the block 58. In some embodiments, the threshold value for the voltage of the battery housing 14 is exceeded and the vehicle control unit 24 determines that damage has occurred to the BEV protection plate 16. In other embodiments, the comparison of the block 56 demonstrated that the voltage of the battery housing 14 was equal to or greater than the voltage of the circuit 18, and the vehicle control unit 24 determines a short-circuit occurred at the block 58. In some embodiments, the comparison of the block 56 shows that the battery housing 14 had a greater than negligible voltage and the vehicle control unit 24 determines at the block 58 that a short-circuit occurred. In some embodiments, the resistance between the battery housing 14 and the circuit 18 are measured and compared at the block 58 to determine if damage has occurred.

In one or more embodiments, after the vehicle control unit 24 determines that a short-circuit has occurred. The vehicle control unit 24 sends a signal and/or request to the display to output a notification to the driver, prior to the block 60.

In some embodiments, the block 60 is omitted. In one or more embodiments, the notification is the icon described in FIG. 1. In some embodiments, the notification is an auditory notification such as an alarm or auditory alert. In some embodiments, the notification is a message on the display 26 that tells the driver that the BEV protection plate 16 has been damaged, punctured, or compromised. In some embodiments, the notification may include if the damage also impacted the battery housing 14.

Figure 6A:
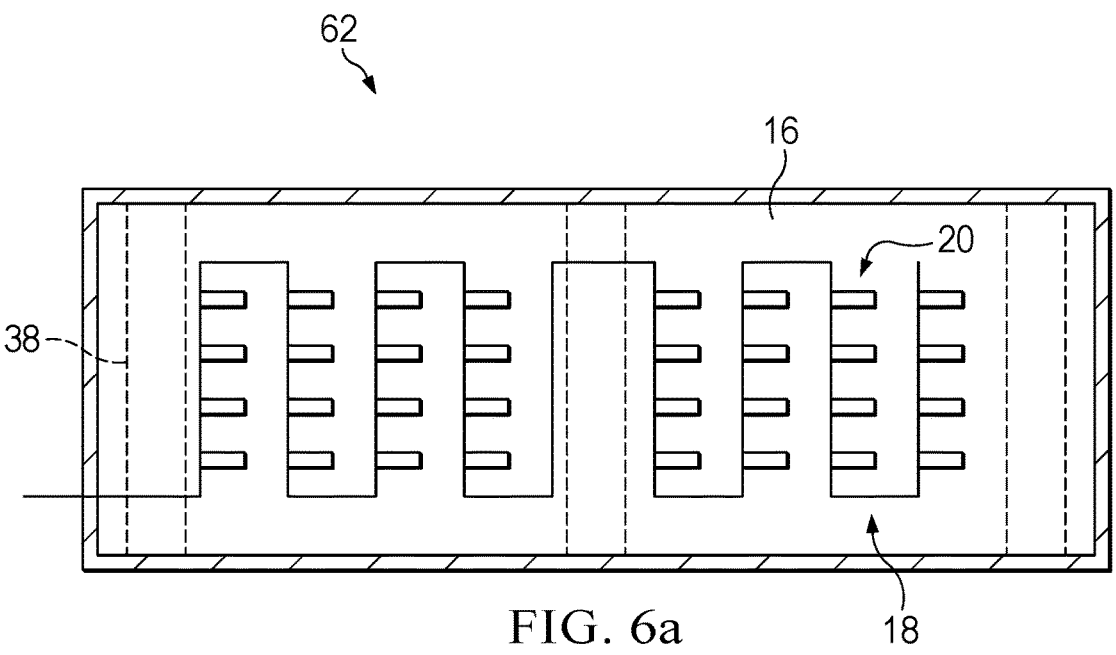
FIG. 6a is a diagrammatic illustration of a top view of a circuit on a BEV protection plate, according to one or more embodiments.

With reference to FIG. 6a and continuing reference to FIGS. 1-5, in an embodiment, a diagrammatic illustration of a top view of a circuit on a BEV protection plate is generally referred to by reference numeral 62 and contains some of the components as shown in the previous figures, the components of which are given the same reference numeral. The BEV protection plate 16 includes circuit 18, and conductive tabs 20. The BEV protection plate 16 is coupled to the at least one support beam 38. The circuit 18 has no conductive tabs 20 underneath the at least one support beam 38.

Figure 6B:
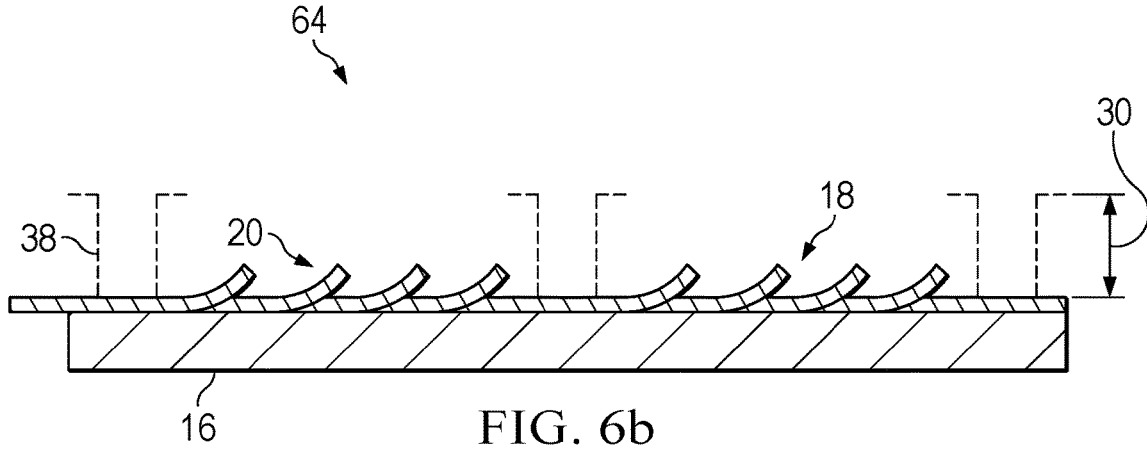
FIG. 6b is a diagrammatic illustration of a side view of the circuit on the BEV protection plate of FIG. 6a, according to one or more embodiments.

With reference to FIG. 6b and continuing reference to FIGS. 1-6a, in an embodiment, a diagrammatic illustration of a side view of a circuit on the BEV protection plate of FIG. 6a is generally referred to by reference numeral 64 and contains some of the components as shown in the previous figures, the components of which are given the same reference numeral. The BEV protection plate 16 includes circuit 18, opening 30, and conductive tabs 20. The BEV protection plate 16 is coupled to the at least one support beam 38. The circuit 18 has no conductive tabs 20 underneath the at least one support beam 38. The opening 30 may be reduced or not present in the area under the at least one support beam 38. The plurality of conductive tabs 20 are shaped in a concave-up pattern.

Figure 7A:
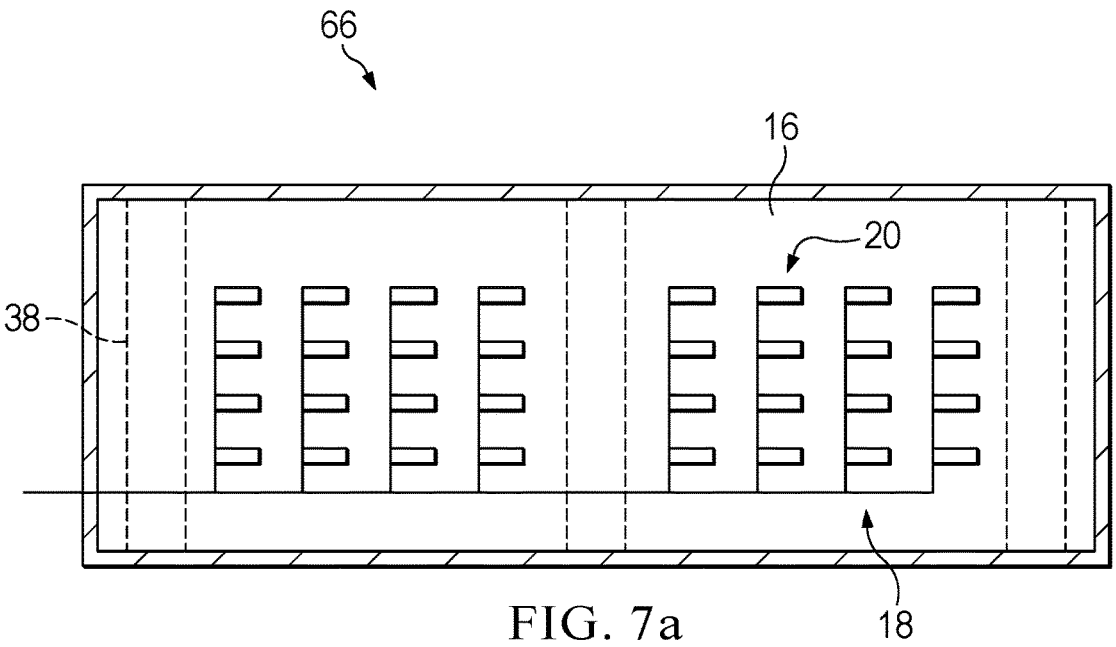
FIG. 7a is another diagrammatic illustration of a top view of a circuit on a BEV protection plate, according to one or more embodiments.

With reference to FIG. 7a and continuing reference to FIGS. 1-5, in an embodiment, a diagrammatic illustration of a top view of a circuit on a BEV protection plate is generally referred to by reference numeral 66 and contains some of the components as shown in the previous figures, the components of which are given the same reference numeral. The BEV protection plate 16 includes circuit 18 and conductive tabs 20. The BEV protection plate 16 is coupled to the at least one support beam 38. The circuit 18 has no conductive tabs 20 underneath the at least one support beam 38. The circuit 18 has a plurality of branches, each branch is representative of a column, and each column has a plurality of conductive tabs 20.

Figure 7B:
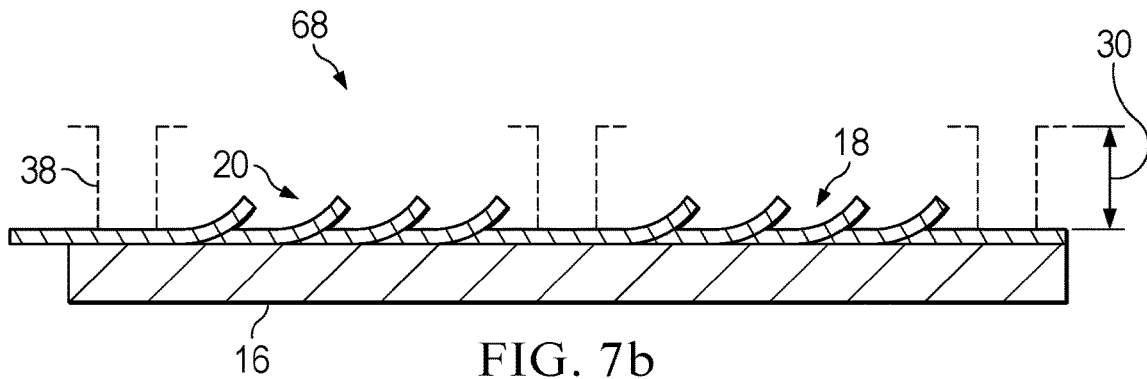
FIG. 7b is another diagrammatic illustration of a side view of the circuit on the BEV protection plate of FIG. 7a, according to one or more embodiments.

With reference to FIG. 7b and continuing reference to FIGS. 1-5 and 7a, in an embodiment, a diagrammatic illustration of a side view of a circuit on the BEV protection plate of FIG. 7a is generally referred to by reference numeral 68 and contains some of the components as shown in the previous figures, the components of which are given the same reference numeral. The BEV protection plate 16 includes circuit 18, opening 30, and conductive tabs 20. The BEV protection plate 16 is coupled to the at least one support beam 38. The circuit 18 has no conductive tabs 20 underneath the at least one support beam 38. The opening 30 may be reduced or not present in the area under the at least one support beam 38. The plurality of conductive tabs 20 are shaped in a concave-up pattern.

Figure 8A:
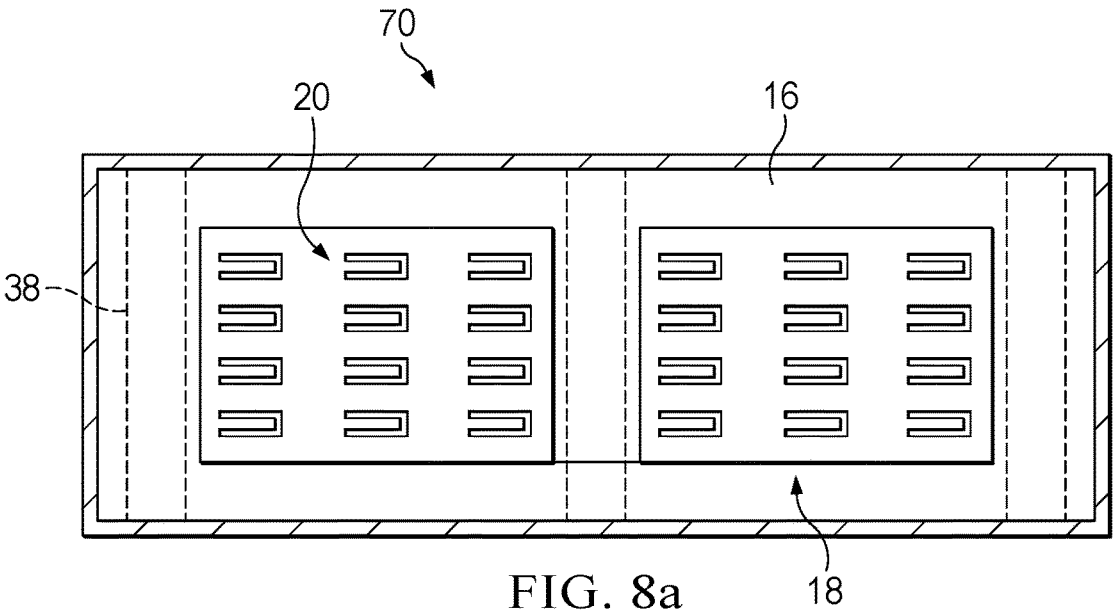
FIG. 8a is yet another diagrammatic illustration of a top view of a circuit on a BEV protection plate, according to one or more embodiments.

With reference to FIG. 8a and continuing reference to FIGS. 1-5, in an embodiment, a diagrammatic illustration of a top view of a circuit on a BEV protection plate is generally referred to by reference numeral 70 and contains some of the components as shown in the previous figures, the components of which are given the same reference numeral. The BEV protection plate 16 includes circuit 18 and conductive tabs 20. The BEV protection plate 16 is coupled to the at least one support beam 38. The circuit 18 has no conductive tabs 20 underneath the at least one support beam 38. The circuit 18 comprises one or more rectangular areas with conductive tabs 20 within the rectangular areas.

Figure 8B:
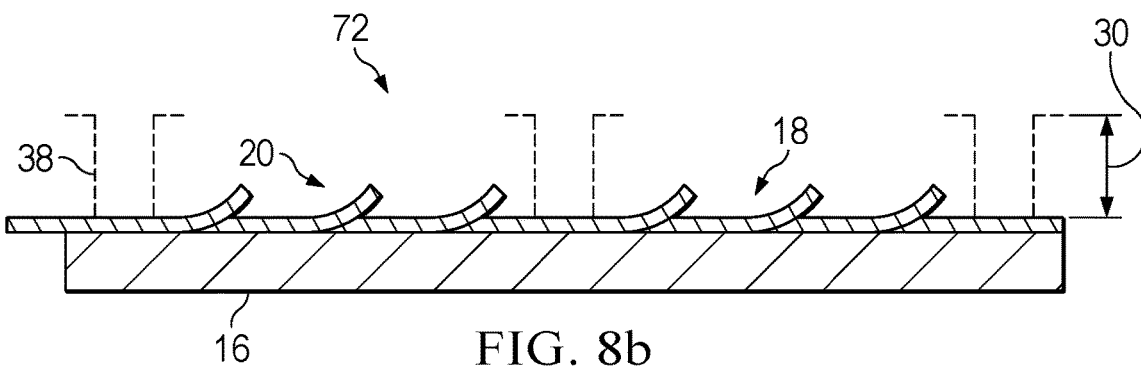
FIG. 8*b* is yet another diagrammatic illustration of a side view of the circuit on the BEV protection plate of FIG. 8*a*, according to one or more embodiments.

With reference to FIG. 8b and continuing reference to FIGS. 1-5 and 8a, in an embodiment, a diagrammatic illustration of a side view of a circuit on the BEV protection plate of FIG. 8a is generally referred to by reference numeral 72 and contains some of the components as shown in the previous figures, the components of which are given the same reference numeral. The BEV protection plate 16 includes circuit 18, opening 30, and conductive tabs 20. The BEV protection plate 16 is coupled to the at least one support beam 38. The circuit 18 has no conductive tabs 20 underneath the at least one support beam 38. The opening 30 may be reduced or not present in the area under the at least one support beam 38. The plurality of conductive tabs 20 are shaped in a concave-up pattern.

With continuing reference to FIGS. 6a-8b, in some embodiments, the area of the BEV protection plate 16 under the at least one support beam 38 is more structurally stable than the areas not under the at least one support beam 38. In some embodiments, the at least one support beam 38 is a support structure, bar, frame, or the like. In one or more embodiments, the opening 30 may be reduced or not present in the area under the at least one support beam 38. In some embodiments, the rectangular area with the conductive tabs is disposed between two support beams of the at least one support beam 38. In some embodiments, conductive tabs 20 are placed in the area of the BEV protection plate 16 between two support beams of the at least one support beam 38. In some embodiments, the circuit 18 is in a row and column formation. In some embodiments, the circuit 18 is a wire with the conductive tabs. In other embodiments, the circuit 18 is a conductive area with conductive tabs 20 (e.g., the rectangular area). In some embodiments, the area with the plurality of conductive tabs 20 of the circuit is a different shape such as square, spiral, or circular. In one or more embodiments, the area with the plurality of conductive tabs 20 of the circuit 18 is a conductive sheet with stamped or machined tabs. In some embodiments, the stamped or machined tabs are the conductive tabs 20. In one or more embodiments, the circuit 18 is in a zig-zag pattern or a branching pattern. In some embodiments, the plurality of conductive tabs 20 are shaped in a spiral, spring, concave, convex, concave-down, concave-up, and other similar shapes. In some embodiments, there are more conductive tabs 20 on one column than another column. In some embodiments, there are more conductive tabs 20 on one row than another row. In some embodiments, one or more conductive tabs 20 are tuned at a different sensitivity (e.g., have a different height) than one or more conductive tabs 20 on the circuit 18. In some embodiments, the plurality of conductive tabs 20 are under the at least one support beam 38. In some embodiments, the plurality of conductive tabs 20 under the at least one support beam 38 are tuned to be less sensitive (i.e., smaller height) than the plurality of conductive tabs 20 not under the at least one support beam 38.

Figure 9A:
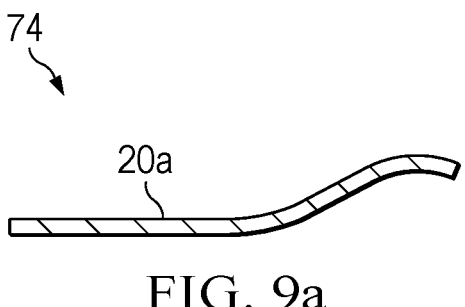
FIG. 9*a* is a diagrammatic illustration of a conductive tab, according to one or more embodiments.

With reference to FIG. 9*a* and continuing reference to FIGS. 1-8*a*, in an embodiment, a diagrammatic illustration of a conductive tab 20*a* is generally referred to by reference numeral 74 and contains some of the components as shown in the previous figures, the components of which are given the same reference numeral. The conductive tab 20*a* is tab with a concave down shape.

Figure 9B:
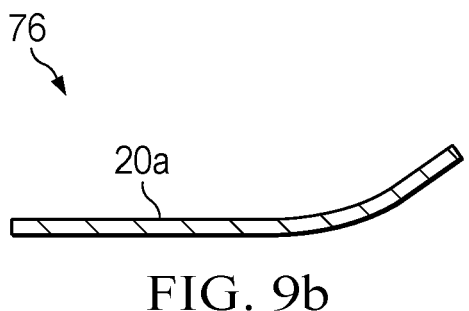
FIG. 9*b* is another diagrammatic illustration of a conductive tab, according to one or more embodiments.

With reference to FIG. 9*b* and continuing reference to FIGS. 1-8*a*, in an embodiment, a diagrammatic illustration of a conductive tab 20*a* is generally referred to by reference numeral 76 and contains some of the components as shown in the previous figures, the components of which are given the same reference numeral. The conductive tab 20*a* is a tab with a concave up shape.

Figure 9C:
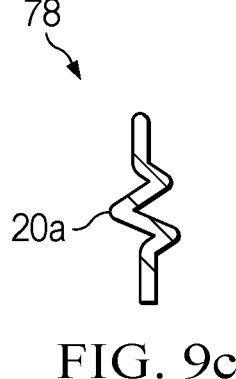
FIG. 9*c* is yet another diagrammatic illustration of a conductive tab, according to one or more embodiments.

With reference to FIG. 9*c* and continuing reference to FIGS. 1-8*a*, in an embodiment, a diagrammatic illustration of a conductive tab 20*a* is generally referred to by reference numeral 78 and contains some of the components as shown in the previous figures, the components of which are given the same reference numeral. The conductive tab 20*a* is a tab with a spring shape.

With continuing reference to FIGS. 9*a*-9*c*, in some embodiments, the plurality of conductive tabs 20 may be any of the shapes of the conductive tab 20*a* from FIGS. 9*a*-9*c*. In some embodiments, the plurality of conductive tabs 20 are concave down, concave up, spiral, spring, or the like shaped. In some embodiments, different shapes of conductive tabs 20 are used for the circuit 18.

In several example embodiments, the elements and teachings of the various illustrative example embodiments may be combined in whole or in part in some or all of the illustrative example embodiments. In addition, one or more of the elements and teachings of the various illustrative example embodiments may be omitted, at least in part, and/or combined, at least in part, with one or more of the other elements and teachings of the various illustrative embodiments.

Any spatial references such as, for example, "upper," "lower," "above," "below," "between," "bottom," "vertical," "horizontal," "angular," "upwards," "downwards," "side-to-side," "left-to-right," "right-to-left," "top-to-bottom," "bottom-to-top," "top," "bottom," "bottom-up," "top-down," etc., are for the purpose of illustration only and do not limit the specific orientation or location of the structure described above.

In several example embodiments, while different blocks, processes, and procedures are described as appearing as distinct acts, one or more of the blocks, one or more of the processes, and/or one or more of the procedures may also be performed in different orders, simultaneously, and/or sequentially. In several example embodiments, the blocks, processes and/or procedures may be merged into one or more blocks, processes, and/or procedures.

In several example embodiments, one or more of the operational blocks in each embodiment may be omitted.

Moreover, in some instances, some features of the present disclosure may be employed without a corresponding use of the other features. Moreover, one or more of the above-described embodiments and/or variations may be combined in whole or in part with any one or more of the other above-described embodiments and/or variations.

The phrase "at least one of A and B" should be understood to mean "A; B; or both A and B." The phrase "one or more of the following: A, B, and C" should be understood to mean "A; B; C; A and B; B and C; A and C; or all three of A, B, and C." The phrase "one or more of A, B, and C" should be understood to mean "A; B; C; A and B; B and C; A and C; or all three of A, B, and C."

Although several example embodiments have been described in detail above, the embodiments described are examples only and are not limiting, and those skilled in the art will readily appreciate that many other modifications, changes, and/or substitutions are possible in the example embodiments without materially departing from the novel teachings and advantages of the present disclosure. Accordingly, all such modifications, changes, and/or substitutions are intended to be included within the scope of this disclosure as defined in the following claims. In the claims, any means-plus-function clauses are intended to cover the structures described herein as performing the recited function and not only structural equivalents, but also equivalent structures. Moreover, it is the express intention of the applicant not to invoke 35 U.S.C. § 112(f) for any limitations of any of the claims herein, except for those in which the claim expressly uses the word "means" together with an associated function.

What is claimed is:

1. A method comprising:
   receiving an indication of a force being applied to a battery electric vehicle (BEV) protection plate,
      wherein the indication of the force being applied comprises at least one conductive tab of a circuit of the BEV protection plate contacting a battery housing; and
      wherein the circuit is disposed on the BEV protection plate;
   measuring, using a diagnostic device, a voltage of the battery housing, wherein the battery housing is conductive; and
   determining, using a controller, a short circuit when the measured voltage passes a threshold value.

2. The method of claim 1, further comprising:
   determining, using a controller, the BEV protection plate has been compromised.

3. The method of claim 2, wherein determining the BEV protection plate has been compromised comprises determining the BEV protection plate has been punctured.

4. The method of claim 1, further comprises:
   output, to a display using the controller, a notification that the BEV protection plate has been compromised.

5. The method of claim 4, wherein the notification is a visual indication that the BEV protection plate has been compromised.

6. The method of claim 1,
   wherein one conductive tab of the at least one conductive tab comprises a first height;
   wherein the first height extends from the circuit on the BEV protection plate into an opening between the BEV protection plate and the battery housing; and
   wherein the opening has a second height.

7. The method of claim 6, wherein prior to receiving the indication of the force being applied, the first height is less than the second height.

8. The method of claim 7, wherein after receiving the indication of the force being applied, the first height is equal to or greater than the second height.

9. The method of claim 1, further comprises:

measuring, using a diagnostic device, a voltage of the circuit.

10. The method of claim 9, wherein determining a short circuit comprises comparing the measured voltage of the battery housing to the measured voltage of the circuit.

11. A system comprising:

a battery housing; and a battery electric vehicle (BEV) protection plate, wherein the battery housing is spaced apart from the BEV protection plate by an opening;

wherein the BEV protection plate comprises a circuit;

wherein the circuit comprises a plurality of conductive tabs; and wherein the plurality of conductive tabs extend from the circuit disposed on the BEV protection plate into the opening.

12. The system of claim 11, wherein the plurality of conductive tabs comprise at least one shape of the one or more shapes:

spiral;

spring;

concave up; or concave down.

13. The system of claim 11, wherein the circuit comprises a conductive sheet; and wherein the plurality of conductive tabs are formed in the conductive sheet by stamping.

14. The system of claim 11, further comprising:

a diagnostic device, wherein the diagnostic device is configured to measure a voltage of the battery housing; and a controller, wherein the controller is configured to determine a short circuit based on the measured voltage.

15. The system of claim 11, further comprising:

one or more support beams, wherein the one or more support beams couple the battery housing to the BEV protection plate.

16. The system of claim 11, further comprising:

a first support beam; and a second support beam, wherein the first support beam and the second support beam couple the battery housing to the BEV protection plate; and wherein a portion of the BEV protection plate extends between the first support beam and the second support beam.

17. The system of claim 16, wherein the portion of the BEV protection plate that extends between the first support beam and the second support beam comprises the conductive tabs.

18. A system comprising:

a battery housing;

a battery electric vehicle (BEV) protection plate, wherein the BEV protection plate comprises a circuit;

wherein the circuit comprises a plurality of conductive tabs;

wherein the BEV protection plate is spaced apart from the battery housing by an opening;

wherein the conductive tabs extend from the circuit disposed on the BEV protection plate into the opening;

a diagnostic device, wherein the diagnostic device is configured to measure a voltage of the battery housing; and a controller in communication with the diagnostic device;

wherein the controller is configured to:

determine a short circuit based on the measured voltage of the battery housing; and output to a display a notification that the BEV protection plate is compromised.

19. The system of claim 18, further comprising:

the display.

20. The system of claim 18, wherein at least one conductive tab of the plurality of conductive tabs contacts the battery housing when a force is applied to an area of the BEV protection plate such that a height of the opening is reduced at the area.

\* \* \* \* \*